United States Patent
Lambrecht et al.

(10) Patent No.: US 6,247,161 B1
(45) Date of Patent: Jun. 12, 2001

(54) DYNAMICALLY CONFIGURED ON-CHIP COMMUNICATIONS PATHS BASED ON STATISTICAL ANALYSIS

(75) Inventors: J. Andrew Lambrecht, Austin; Alfred C. Hartmann, Round Rock; Gary Michael Godfrey, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/145,011

(22) Filed: Sep. 1, 1998

Related U.S. Application Data

(63) Continuation-in-part of application No. 08/970,691, filed on Nov. 14, 1997, which is a continuation-in-part of application No. 08/957,589, filed on Oct. 24, 1997, which is a continuation-in-part of application No. 08/783,433, filed on Jan. 16, 1997.

(51) Int. Cl.[7] ............................................. G06F 17/50
(52) U.S. Cl. ................... 716/1; 716/12; 716/13; 716/14; 710/131
(58) Field of Search ........................ 716/1, 12, 13, 716/14; 710/131, 101, 260; 709/251, 252; 370/406, 407, 425, 452

(56) References Cited

U.S. PATENT DOCUMENTS

| | | | |
|---|---|---|---|
| 4,293,948 | 10/1981 | Soderblom | 370/424 |
| 4,468,734 | 8/1984 | Lanier et al. | 714/4 |
| 4,797,882 | 1/1989 | Maxemchuk | 370/406 |
| 4,825,206 | 4/1989 | Brice, Jr. et al. | 340/825.02 |
| 4,933,933 | 6/1990 | Dally et al. | 370/406 |
| 5,041,963 | * 8/1991 | Ebersole et al. | 370/407 |
| 5,138,615 | 8/1992 | Lamport et al. | 370/400 |

(List continued on next page.)

OTHER PUBLICATIONS

Itano, et al "HIRB: A Hierarchical Ring Bus" University of Tsukuba, Japan, Proceedings of the Nineteenth Annual Hawaii International Conference on System Sciences, 1986, pp 206–213.

*Primary Examiner*—Matthew Smith
*Assistant Examiner*—Vuthe Siek
(74) *Attorney, Agent, or Firm*—Conley, Rose & Tayon PC; Jeffrey C. Hood

(57) ABSTRACT

A computer chip including a data transfer network which comprises a plurality of communications links for transmitting data, a plurality of communication nodes, and a plurality of modules. Each of the communication nodes is directly connected to two or more other communication nodes through respective ones of the communications links. Each communication node is operable to communicate data over the respective one of the communications links. Each module is coupled to at least one of the communication nodes, and the modules are operable to communicate with each other through the communication nodes. The communication nodes are operable to create dynamic routes for the data transferred between any two or more of the plurality of modules over the respective ones of the communications links. The communication nodes form the dynamic routes based on statistical data on previous transmissions between the modules. Each communication node may include respective configuration logic for dynamically configuring the dynamic routes, and each configuration logic may include a memory for storing the statistical data on previous transmissions that passed through the respective communications node. The data transfer network may also comprise a routing module for controlling the dynamic routes based on statistical data. The routing module couples to each communication node and monitors the configuration logic. When present and functioning, the routing module adapts the dynamic routes based on an analysis of the statistical data. The statistical data includes one or more of the following for each respective transmission: priority, source module, destination module, number of data units, elapsed transfer time or minimum required transfer time, and total number of transmissions which pass through a given communications node.

12 Claims, 5 Drawing Sheets

U.S. PATENT DOCUMENTS

| | | | |
|---|---|---|---|
| 5,153,876 | * 10/1992 | Sin | 370/392 |
| 5,394,389 | 2/1995 | Kremer | 370/223 |
| 5,400,331 | * 3/1995 | Lucak et al. | 370/401 |
| 5,577,213 | * 11/1996 | Avery et al. | 710/131 |
| 5,715,397 | * 2/1998 | Ogawa et al. | 709/246 |
| 5,761,516 | 6/1998 | Rostoker et al. | 710/260 |
| 5,872,998 | * 2/1999 | Chee | 710/56 |
| 5,908,468 | * 6/1999 | Hartmann | 710/131 |

* cited by examiner

DYNAMICALLY CONFIGURED ON-CHIP COMMUNICATIONS PATHS BASED ON STATISTICAL ANALYSIS

CONTINUATION DATA

This is a continuation-in-part of co-pending application Ser. No. 08/970,691, filed Nov. 14, 1997 titled "Data Transfer Network on a Computer Chip Using a Re-Configurable Path Multiple Ring Topology", whose inventors are Gary Michael Godfrey, J. Andrew Lambrecht and Alfred C. Hartmann; which is a continuation-in-part of co-pending application Ser. No. 08/957,589, filed Oct. 24, 1997, titled "Data Transfer Network on a Computer Chip Utilizing Combined Bus and Ring Topologies", whose inventors are Gary Michael Godfrey, J. Andrew Lambrecht and Alfred C. Hartmann; which is a continuation-in-part of co-pending application Ser. No. 08/783,433, filed Jan. 16, 1997, titled "Communication Traffic Circle System and Method for Performing Packet Conversion and Routing Between Different Packet Formats," whose inventor is Alfred C. Hartmann.

BACKGROUND OF THE INVENTION

1. Field of the Invention

The present invention relates to computer chip architectures, and more particularly to an on-chip data transfer network that includes a multiple ring architecture with re-configurable paths for improved information routing between multiple on-chip modules.

2. Description of the Related Art

Computer systems have traditionally comprised a system unit or housing which comprises a plurality of electrical components comprising the computer system. A computer system typically includes a motherboard, which is configured to hold the microprocessor and memory, and the one or more busses used in the computer system. The motherboard typically comprises a plurality of computer chips or electrical components including intelligent peripheral devices, bus controllers, processors, bus bridges, etc.

More recently, computer systems are evolving toward an integration of functions into a handful of computer chips. This coincides with the ability of chip makers to place an increasingly large number of transistors on a single chip. For example, currently chip manufacturers are able to place up to ten million transistors on a single integrated circuit or monolithic substrate. It is anticipated that within several years chip makers will be able to place one billion transistors on a single chip. Thus, computer systems are involving toward comprising a handful of computer chips, where each computer chip comprises a plurality of functions. The integration of a plurality of modules or functions on a single computer chip requires an improved data transfer chip architecture. Also, due to the shorter distances and tighter integration of components on a chip, new data transfer architectures are necessary to take advantage of this environment. Therefore, an improved system and method is desired for including a plurality of different functions or modules on a single computer chip while providing efficient data transfers.

SUMMARY OF THE INVENTION

The present invention comprises a computer chip including a data transfer network. The data transfer network comprises a plurality of communications links for transmitting data, a plurality of communication nodes, and a plurality of modules. Each of the communication nodes are directly connected to two or more other communication nodes through respective ones of the plurality of communications links. Each of the communication nodes is operable to communicate data over the plurality of communications links. Each of the plurality of modules is coupled to at least one of the plurality of communication nodes, and the plurality of modules are operable to communicate with each other through the communication nodes. The plurality of communication nodes are operable to create dynamic routes for the data transferred between any two or more of the plurality of modules over the respective ones of the plurality of communications links. The plurality of communication nodes form the dynamic routes based on statistical data on previous transmissions between the plurality of modules.

In various embodiments, each of the plurality of communication nodes includes respective configuration logic for dynamically configuring the dynamic routes, and each of the configuration logics may include a memory for storing the statistical data on previous transmissions which passed through a respective communications node. Each of the data transmissions includes transfer information regarding a source, a destination, a number of data units, and a time value indicating an initialization of transfer. Configuration logic in each communication node monitors the data transmissions and extract the transfer information to obtain the statistical data. The data transfer network may also comprise a routing module for controlling the dynamic routes based on statistical data. The routing module couples to each of the plurality of communication nodes and monitors the configuration logic. When present and functioning, the routing module adapts the dynamic routes based on an analysis of the statistical data.

In various embodiments, the statistical data includes one or more of the following for each respective transmission: a priority, a source, a destination, a number of data units included, an elapsed transfer time or a maximum allowed delivery time, and a total number of transmissions which pass through a given communications node. In one embodiment, the plurality of communication nodes is bi-directionally coupled and is operable to communicate data with each other.

BRIEF DESCRIPTION OF THE DRAWINGS

A better understanding of the present invention can be obtained when the following detailed description of the preferred embodiment is considered in conjunction with the following drawings, in which.

Figure 1:
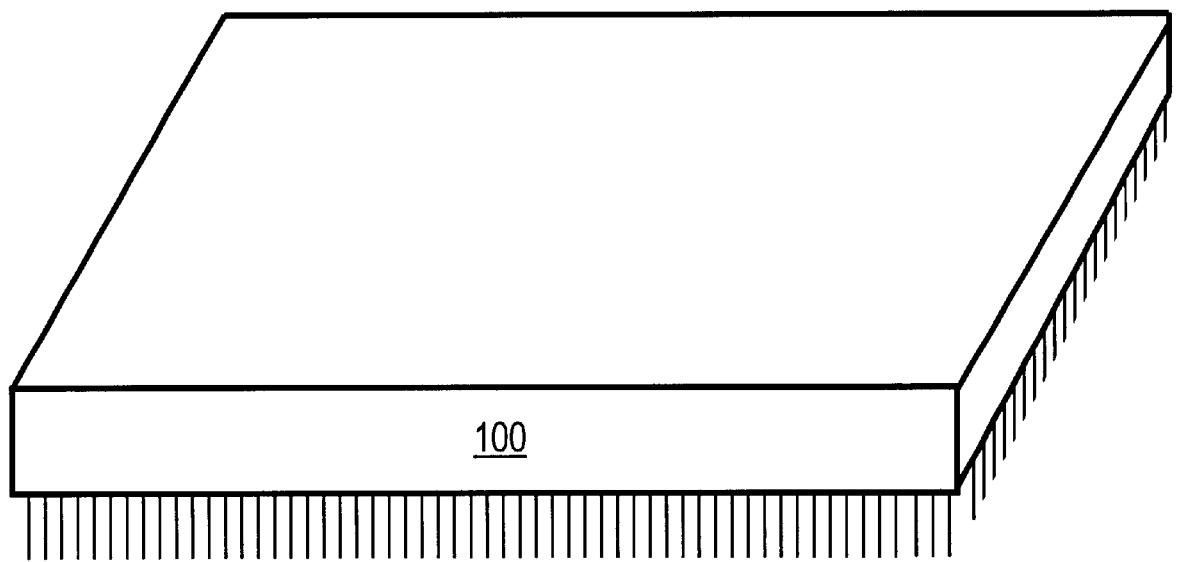
FIG. 1 illustrates a computer chip comprising an on-chip data transfer network according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION OF THE EMBODIMENTS

Incorporation by Reference

The following U.S. patent application is hereby incorporated by reference in its entirety as though fully and completely set forth herein.

U.S. patent application Ser. No. 08/969,860, titled "Variable Latency and Bandwidth Communication Pathways" filed Nov. 14, 1997, whose inventors are J. Andrew Lambrecht and Alfred C. Hartmann.

The present invention comprises an on-chip data transfer network which includes a traffic circle architecture and a bus architecture for improved information routing between multiple on-chip modules. A uniform numbering system is adopted for this application. All components referred to with a common number are to be considered equivalent.

FIG. 1—Computer Chip

Referring now to FIG. 1, a computer chip 100 is shown from an aspect view. Computer chip 100 preferably comprises a monolithic silicon substrate comprising a plurality of transistors, according to the present invention. The computer chip may also use gallium arsenide (GaAs) or another suitable semiconductor material. Although shown as a ceramic socket mount pin grid array (PGA) package, the computer chip 100 may be packaged in any of various ways, including as a surface mount, socket mount, or insertion/socket mount. Materials used in the packaging of computer chip 100 may include ceramic packages, leadless chip carrier packages (LCC), glass-sealed packages, or plastic packages. Actual type of chip package for computer chip 100 may include, ceramic quad flatpack (CQFP), PGA, ceramic dual in-line package (C-DIP), LCC socket or surface mount, ceramic dual in-line package (CERDIP), ceramic quadpack (CERQUAD), small outline package gull wing (SOP), small outline package J-lead (SOJ), thin small outline package (TSOP) etc. and may have any of various types of connectivity including pin grid array (PGA), ball grid array (BGA), direct chip attach (DCA), metal bands or pins etc. Also usable is the controlled collapse chip connection (C4) method, commonly known as the "flip chip" method.

Computer chip 100 preferably utilizes a generic method for interconnecting multiple module types on a single computer chip 100 using intelligent buffering and a universal node design. Connecting each module to a communications pathway with a full duplex, general purpose communications node allows for heterogeneous and homogeneous module types to form a networked system on a single computer chip. The present invention allows "system on a chip" producers to integrate module designs from different sources or module core vendors. This promotes integration of "best of breed" cores from an evolving industry of "virtual component" suppliers. Further details of the components of the computer chip will be given in the descriptions of FIG. 2–4 using the uniform numbering system.

Figure 2:
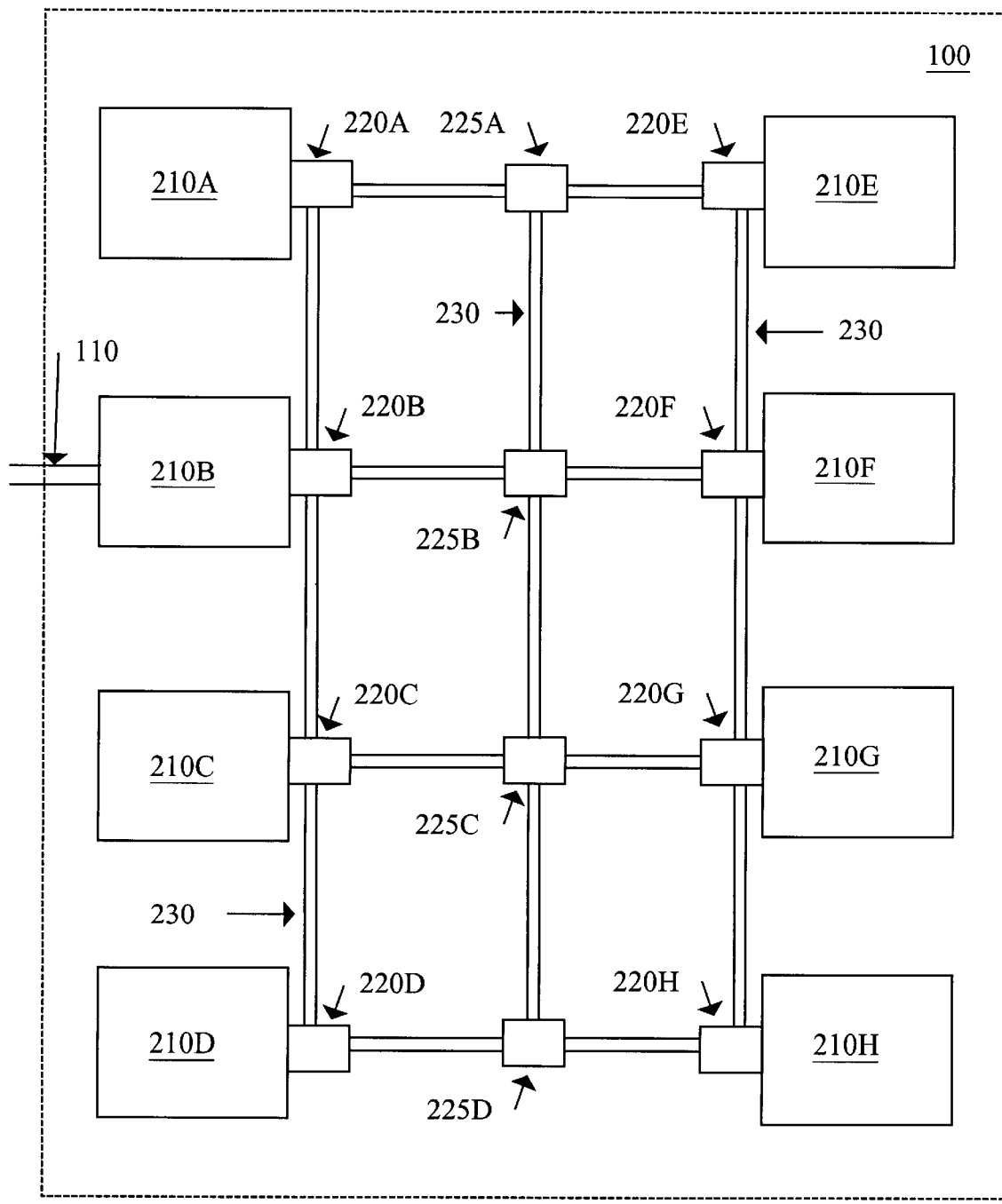
FIG. 2 illustrates an embodiment of the on-chip data transfer network shown in FIG. 1 according to the present invention.

FIG. 2—Data Transfer Network

Referring now to FIG. 2, an embodiment of computer chip 100 with an on-chip data transfer network is shown, for interconnecting a plurality of devices or modules 210A–210H linked by a plurality of communication nodes 220A–220H on single computer chip 100. The components of the network preferably include a bus 230 with the plurality communication nodes 220A–220H coupled to the bus 230 as well as a plurality of communication nodes 225A–225D coupled to segments of the bus 230. The bus 230 is comprised of the individual buses connecting between and among nodes 220A–220H and/or nodes 225A–225D. Communications nodes 225 are preferably a subset of the plurality of communication nodes 220 operable to transmit and receive data only on the bus 230. A reference to bus 230 may refer to the entire bus system or to a particular segment or component. The term bus as used in this disclosure is meant to extend to a bus which passes data along its entire physical length during a single transmission, as well as to a communications or transfer link which uses point-to-point data transmission.

Each of the plurality of modules 210 is coupled to at least one of the plurality of communication nodes 220. In various embodiments, communication nodes 220 and modules 210 are either directly connected or completely integrated as a single unit. The plurality of modules 210 are configurable to communicate with each other through the communication nodes 220. Modules 210 preferably perform operations, like a processor or an I/O controller, or storage like a memory, or a hybrid task, like a task specific hybrid (ASIC) or a task general hybrid.

Starting on the left side of FIG. 2, moving top to bottom, modules 210A–210D are respectively coupled to the bus 230 via communication nodes 220A–220D. Module 210B couples off-chip through off-chip bus 110. In the center, communication nodes 225A–225D are coupled to segments of the bus 230. On the right side of the figure modules 210E–210H are coupled to the bus 230 via communication nodes 220E–220H. Communication nodes 220A and 220E are electrically coupled to communication node 225A by bus 230. Likewise, communication node pairs 220B and 220F are electrically coupled to communication node 225B, communication node pairs 220C and 220G are electrically coupled to communication node 225C, and communication node pairs 220D and 220H are electrically coupled to communication node 225D by segments of bus 230. In another embodiment, all or part of the connections and communications are optical or chemical instead of electrical.

Although FIG. 2 shows eight communication nodes 220 electrically coupled for information transmission on a bus 230 along with four communication nodes 225, one skilled in the art could add or subtract from these numbers as desired. Additionally, FIG. 2B shows each module 210 coupled to the bus 230 by only one communication node 220, one skilled in the art might also choose to connect a particular module 210 to more than one place on bus 230 through one or more additional communications nodes 220 or 225. For each coupling of objects or means, the coupling could be electrical, optical or mechanical as desired. Although not shown in FIG. 2, routing between different computer chips 100 in similar fashions are also contemplated.

In one embodiment, the plurality of buses 230 coupled between the plurality of communications nodes 220 and/or 225 are operable to dynamically select different ones of the buses 230 to dynamically form one or more separate communication paths. These communication paths may cross each other, and some communications nodes 220 and/or 225 and/or bus segments may be included in more than one communication path concurrently. Transmissions on one path may be blocked and create a desire to re-routing over a new path for increased speed or efficiency. The grid-like shape shown in FIG. 2B, for example, may be expanded to form any geometry or hyper-geometric representation. As an example, more columns of communications nodes 225 coupled via buses 230 may be added to provide additional nexus points for the re-configurable communication paths. Each communications node 220 and/or 225 preferably includes configuration logic 360 which either controls the re-configurable communication paths or accepts configuration input from the modules 210 or other, possibly off chip, masters, such as via off-chip bus 110.

Each of the data transmissions preferably includes transfer information regarding that data transmission. Required transfer information include a source location or device, a destination location or device, and a size of the data transmission, such as a number of data units, such as bits or bytes, in the data transmission. Optional transfer information include a time value indicating when the data transfer was initialized, a priority value or importance of delivery for the data transmission, a time by which the data transmission is required to have reached its destination, or other information, or quality of service measure, that can be analyzed using statistical methods. The configuration logic in each communication node is operable to monitor the data transmissions which are passed through the respective communication node. The configuration logic extracts part or all of the transfer information to obtain and/or maintain the statistical data. In one embodiment, each configuration logic includes a memory for storing the transfer information on the previous data transmissions which passed through the respective communications node. Processing power in the configuration logic performs necessary statistical calculations.

In the preferred embodiment, the dynamically formed data routes for the data are based on statistical data from previous transmissions between the plurality of modules 210. In one embodiment, the statistical data, based on the transfer information, is accumulated and stored in the communication nodes 220. In another embodiment, the statistical data is accumulated and stored in the modules 210. Examples of statistical data which are contemplated for association with any given data transmission or aggregate of transmissions include the priority value, the source module 210, the destination module 210, the size of the data transmission, the total transfer time between any two points on the computer chip 100, the required time within which the data transfer must be completed, the total number transmissions to/from a particular module 210 and through a communication node 220/225, and a total number of transmissions between any two locations. In one embodiment, transfers which are "at risk" are identified and routed around problem areas of the network. For example, "per segment data" may be used to determine which segments need to be routed around. Other data values for use in statistically analyzing routing information may also be collected and used. Statistical methods contemplated for use include frequentist, Baysian, or heuristic methods.

Each of the data transmissions preferably includes transfer information regarding that data transmission. Required transfer information include a source location or device, a destination location or device, and a size of the data transmission, such as a number of data units, such as bits or bytes, in the data transmission. Optional transfer information include a time value indicating when the data transfer was initialized, a priority value for the data transmission, a time by which the data transmission is required to have reached its destination, the importance that the data actually reach the destination, or other information which can be analyzed using statistical methods. The configuration logic in each communication node is operable to monitor the data transmissions that are passed through the respective communication node. The configuration logic extracts part or all of the transfer information to obtain and/or update the statistical data. In one embodiment, each configuration logic includes a memory for storing the transfer information on the previous data transmissions which passed through the respective communications node.

In a preferred embodiment, the computer chip 100 includes a routing module (not shown) which collects the statistical information from the collection location, modules 210 or communication nodes 220/225, etc., and analyzes the statistical data. The routing module then relays dynamic routes back to the communication nodes 220/225 for the routing of each data transmission. Since the routing is dynamic, the route for any given data transmission is contemplated as changing at any or all communication nodes 220/225. In one embodiment, the routing module operates to control all data transmissions on the computer chip 100. Additional details concerning FIG. 2 are disclosed below.

Figure 3A:
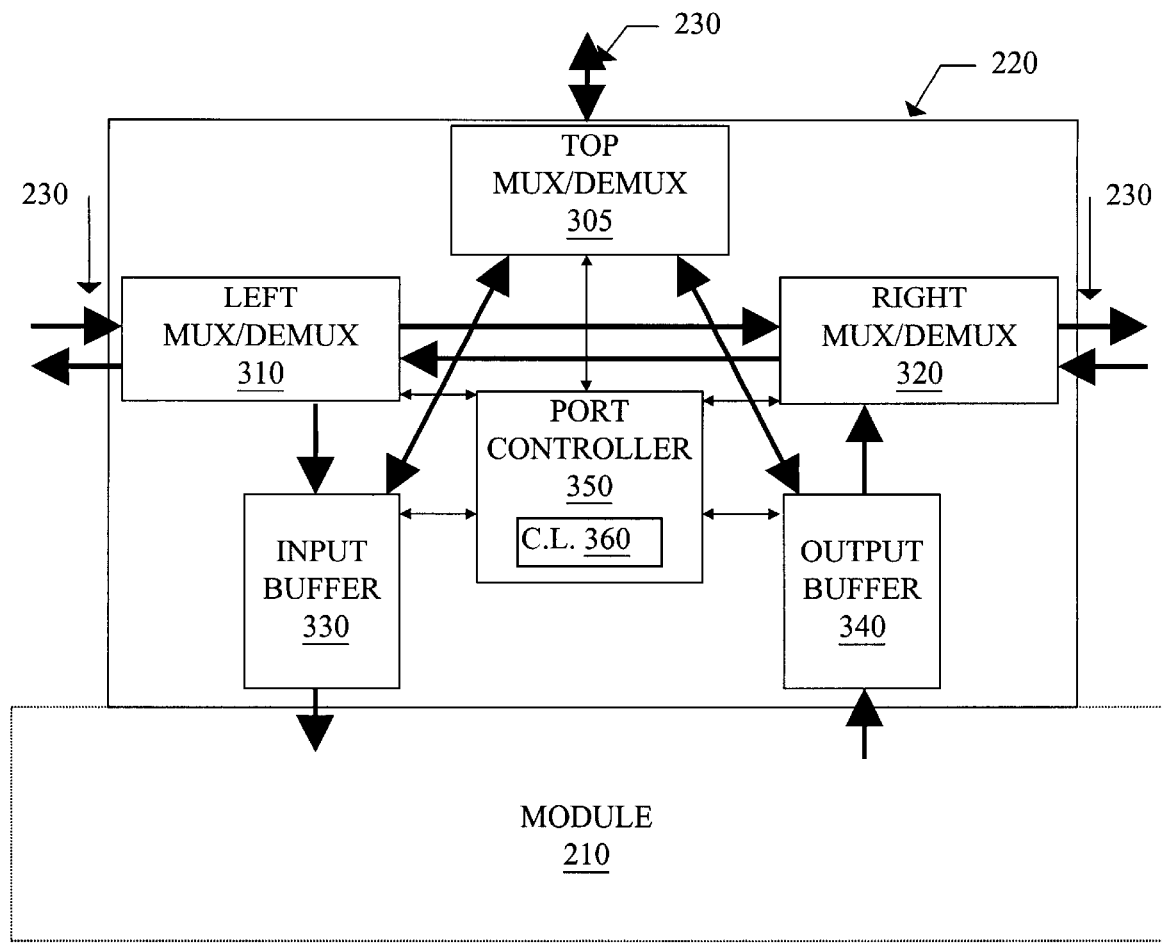
FIG. 3A illustrates an embodiment of a communication node shown in FIG. 1 according to the present invention.

FIG. 3A—Communication Node

Referring now to FIG. 3A, an embodiment of communication node 220 is shown along with the couplings between communication node 220 and bus 230. Although communication node 220 is shown as a separate item from module 210, in another embodiment communication node 220 may be incorporated into module 210. Preferably included as components of communication node 220 are top multiplexer (MUX)/demultiplexer(DEMUX) 305 coupled to one segment of the bus 230, a pair of MUX/DEMUXs, left MUX/DEMUX 310 and right MUX/DEMUX 320, each coupled to other segments of bus 230, input buffer 330, output buffer 340 and node controller 350. Left MUX/DEMUX 310 and right MUX/DEMUX 320 are coupled together. Left MUX/DEMUX 310 is further coupled to input buffer 330, which is further coupled to module 210. Right MUX/DEMUX 320 is further coupled to output buffer 340 which is also coupled to module 210.

Operations of communication node 220 are preferably controlled by the node controller 350 which preferably includes bus interface logic (not shown) and configuration logic 360 for selectively routing data between and/or among the various buses 230. All included components of node controller 350 may also be comprised in module 210 or a separate part of computer chip 100. In a preferred embodiment, node controller 350, including bus interface logic and configuration logic 360, is coupled to various segments of the bus 230. As shown in FIG. 5 the node controller 350 issues communications and/or commands to top MUX/DEMUX 305, left MUX/DEMUX 310, right MUX/DEMUX 320, input buffer 330 and output buffer 340. In addition top MUX/DEMUX 305 is coupled to input buffer 330 and output buffer 340.

Controller 350 is preferably operable to control transfer of data to and from one segment of bus 230 and module 210 by way of top MUX/DEMUX 305 via input buffer 330 and output buffer 340. Node control 350 is also preferably operable to control information transfer between other segments of bus 230 and module 210 by regulating transfer of data from module 210 to output buffer 340 through the right MUX/DEMUX 320 and onto bus 230. In this embodiment node controller 350 controls transfer of data from the various segments of the bus 230 to other various segments of the bus 230 through transfer of data from top MUX/DEMUX 305 to output buffer 340 through right MUX/DEMUX 320 and then onto bus 230. Optionally, right MUX/DEMUX 320 can routed data through left MUX/DEMUX 310 before it is transferred to bus 230. The reverse data transfers are also possible.

Input buffer 330 and output buffer 340 may also be comprised as part of module 210. Top MUX/DEMUX 305, left MUX/DEMUX 310, and right MUX/DEMUX 320, input buffer 330 and output buffer 340 may interchangeably be data transfer buffers and/or multiplexers and/or demultiplexers. Each communication node 220 preferably includes one or more data transfer buffers. At least a first portion of the one or more data transfer buffers is coupled to the bus interface logic that is preferably part of node controller 350. The first portion of the one or more data transfer buffers is configurable to communicate information between the module 210 and the various segments of the bus 230. A second portion of the one or more data transfer buffers is coupled to the bus interface logic preferably included in node controller 350. The second portion of the one or more data transfer buffers is configurable to communicate information among the various segments of the bus 230.

In a preferred embodiment, the statistical data are collected and maintained in or by the configuration logic 360. Dynamic routing occurs in any communications node 220 based upon the statistical data. In one embodiment, the configuration logic 360 transmits the statistical data to a routing module for analysis and decision making on the dynamic routing of each data transmission. In another embodiment, the configuration logic 360 performs the analysis and decision making based upon the statistical data either stored therein or combined with additional statistical data shared by the remaining configuration logics 360 in the other communication nodes 220/225.

In one embodiment, the destination calculates the actual values for the latency/transfer time, etc. and updates the maintained data and/or statistics for the path actually followed by the message, along with all message characteristics. Examples of message characteristics include priority, latency for each segment traversed, etc. Other potential message characteristics are given elsewhere in this disclosure. Examples of maintained values might include: buses or segments in the path, such as A to B to E to F, transfer types based on priority levels, maximum/minimum/mean latencies, number of re-routes due to changing conditions, etc.

Additional and more specific examples of the usage of the statistical data include the following:

A. Communication node 225A receives a data transmission over bus 230 from module 210A, which is bound for module 210H. Based on the statistical data, the mean transmission times (latency) of over bus 230 to communication node 225B are lowest, meaning that those past transmissions are received by module 210H faster than past transmissions over bus 230 to communication node 220E. The configuration logic 360 in communication node 225A routes the data transmission over bus 230 to communication node 225B.

B. Communication node 225B finds that bus 230 between communication nodes 220B and 225B has less traffic than the other links of bus 230 which connect to communication node 225B. The configuration logic 360 in communication node 225B then routes the next data transmissions over bus 230 to communication node 220B in an effort to speed up the overall data transmission rate on the computer chip 100.

It is contemplated that any of the various statistical calculations, such as determination of means, determination of variances, comparison tests, etc., may be used to determine a preferred dynamic route for any given data transmission.

In another embodiment, computer chip 100 includes an additional plurality of buffers with each of the buffers coupled between their respective communication node 220 and the bus 205. This plurality of buffers is operable for buffering data between a respective communication node 220 and the bus 230. Additional details concerning FIG. 3A are disclosed elsewhere under the uniform numbering system.

Figure 3B:
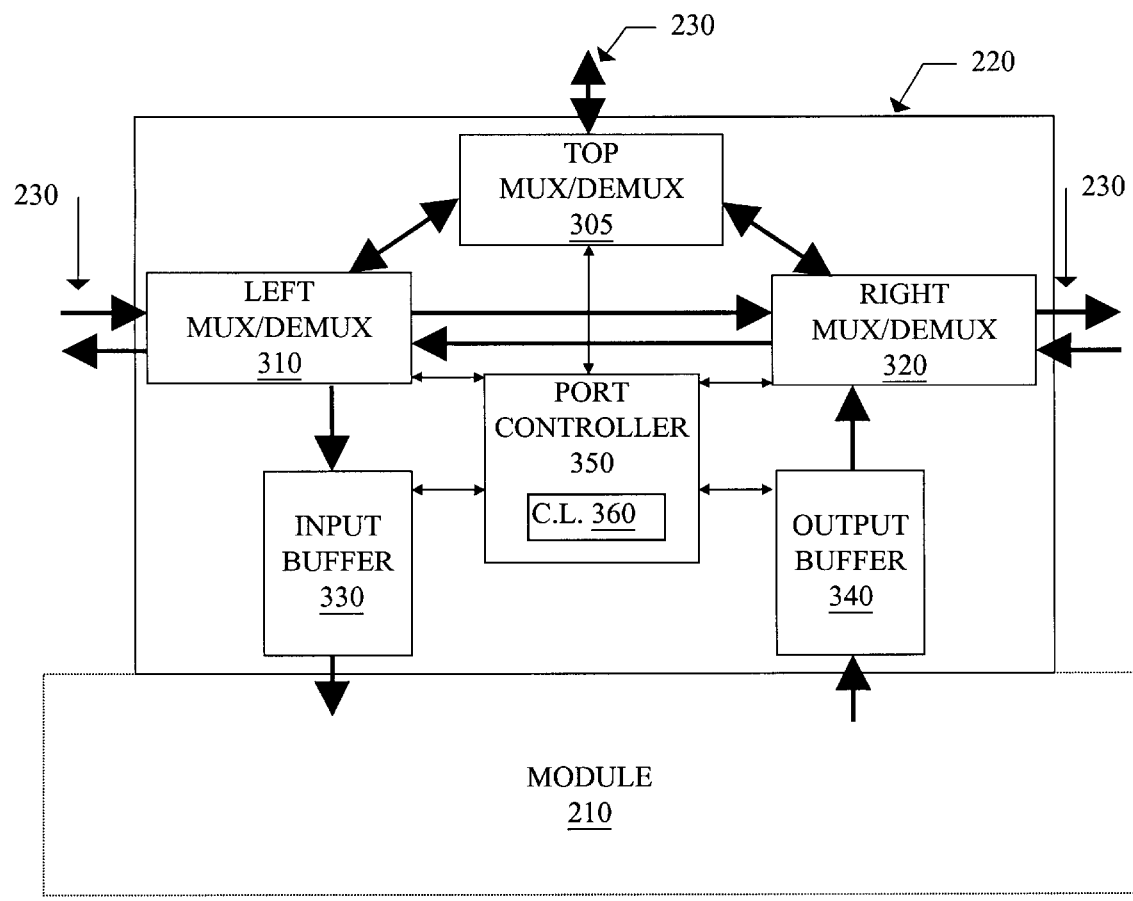
FIG. 3B illustrates another embodiment of a communication node shown in FIG. 1 according to the present invention.

FIG. 3B—Another Communications Node

Referring now to FIG. 3B, an embodiment is shown of communications node 220 wherein data transfers among the bus 230 and the module 210 are made from top MUX/DEMUX 305 directly to and from left MUX/DEMUX 310 and/or right MUX/DEMUX 320. In this embodiment top MUX/DEMUX 305 is not connecting to input buffer 330 or output buffer 340. Otherwise the components, operations and designations in FIG. 3B are the same as FIG. 3A. Other connections between MUX/DEMUXes and buffers are also contemplated. Additional details concerning FIG. 3B are disclosed elsewhere under the uniform numbering system.

Figure 4:
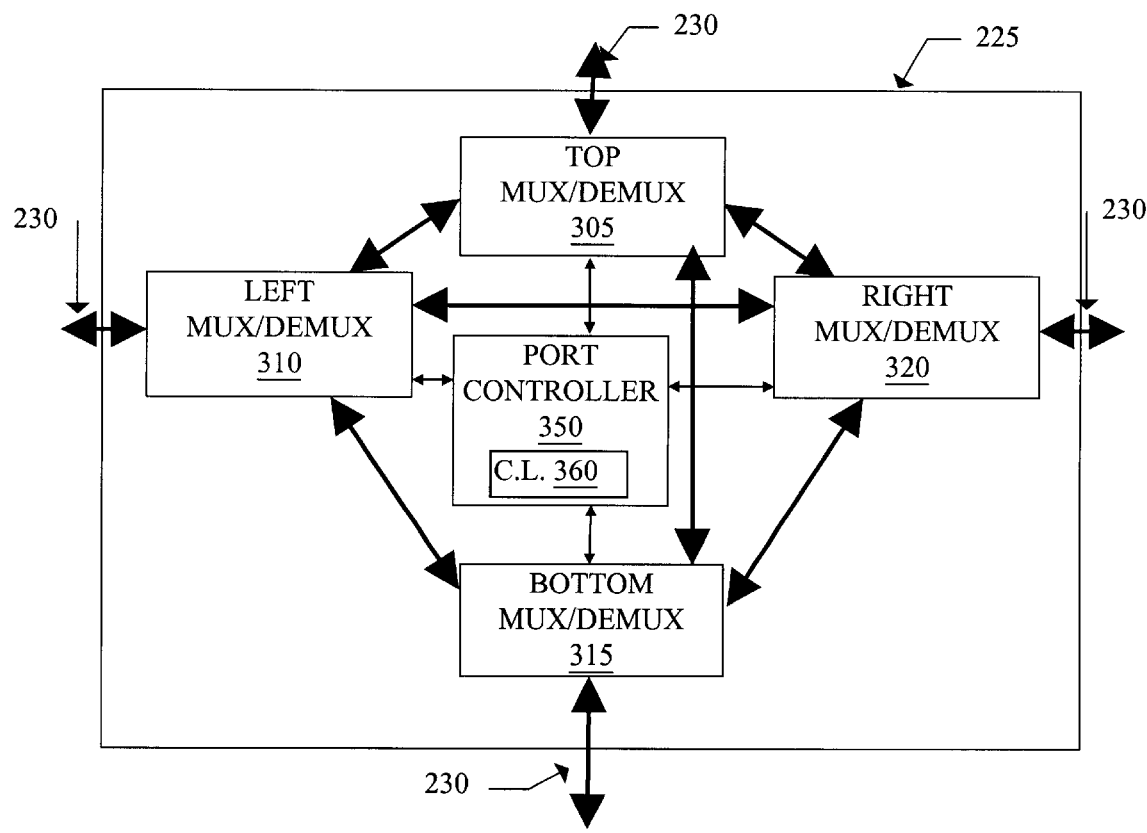
FIG. 4 illustrates a different embodiment of a communication node according to the present invention.

FIG. 4—Four Way Communications Node

Referring now to FIG. 4, an embodiment is shown of communications node 225 for data transfers among the various segments of the bus 230. The illustrated embodiment is similar in design to the embodiment of communications node 220 shown in FIG. 3B with the input buffer 330 and the output buffer 340 replaced by a bottom MUX/DEMUX 315 coupled to the top MUX/DEMUX 305, left MUX/DEMUX 310 and right MUX/DEMUX 320. Control of the bottom MUX/DEMUX 315 is preferably by the node controller 350 as shown.

In a preferred embodiment, the statistical data are collected and stored in the configuration logic 360. Dynamic routing occurs in any communications node 225 based upon the statistical data. In one embodiment, the configuration logic 360 transmits the statistical data to a routing module for analysis and decision making on the dynamic routing of each data transmission. In another embodiment, the configuration logic 360 performs the analysis and decision making based upon the statistical data either stored therein or combined with additional statistical data shared by the remaining configuration logics 360 in the other communication nodes 220/225.

Communications node 225 is shown with all four units 305, 310, 315, and 320 coupled to four segments of the bus 230. Alternatively, top MUX/DEMUX 305 and/or bottom MUX/DEMUX 315 is coupled to the backbone bus 205 or a module 210. When configured as coupled to one or more of the modules 210, communications node 225 becomes an embodiment of communications node 220. Otherwise the components, operations and designations in FIG. 4 are similar to those in FIGS. 3A and 3B. Additional details concerning FIG. 4 are disclosed elsewhere under the uniform numbering system.

Conclusion

Although the system of the present invention has been described in connection with the preferred and various embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A computer chip comprising a data transfer network, the computer chip comprising:

a plurality of communications links for transmitting data;

a plurality of communication nodes, wherein each of said communication nodes are directly connected to one or more other communication nodes through respective ones of said plurality of communications links, wherein each of said communication nodes are operable to communicate data over the plurality of communications links; and a plurality of modules, wherein each of said plurality of modules is coupled to at least one of said plurality of communication nodes, wherein said plurality of modules are operable to communicate with each other through data transmissions via said communication nodes;

wherein said plurality of communication nodes are operable to create dynamic routes for the data transmissions transferred between any two or more of said plurality of modules over said respective ones of said plurality of communications links, wherein said plurality of communication nodes form said dynamic routes based on statistical data on previous data transmissions between said plurality of modules.

2. The computer chip of claim 1, wherein each of said plurality of communication nodes includes respective configuration logic for dynamically configuring said dynamic routes.

3. The computer chip of claim 2, wherein each of said configuration logics includes a memory for storing said statistical data on the previous data transmissions which passed through a respective communications node.

4. The computer chip of claim 2, wherein each of said data transmissions includes transfer information regarding a source, a destination, a number of data units, and a time value indicating an initialization of transfer, wherein said configuration logics are operable to monitor said data transmissions and extract said transfer information to obtain and calculate said statistical data.

5. The computer chip of claim 4, wherein each of said configuration logics includes a memory for storing said transfer information on the previous data transmissions which passed through a respective communications node.

6. The computer chip of claim 5, where said configuration logics are operable to store said statistical data in said memory.

7. The computer chip of claim 2, further comprising:

a routing module for controlling said dynamic routes based on statistical data, wherein said routing module is coupled to each of said plurality of communication nodes, wherein said routing module monitors said configurations logics, and wherein said routing module adapts said dynamic routes based on an analysis of said statistical data.

8. The computer chip of claim 1, wherein said statistical data include one or more of the following for each respective data transmission or aggregate of said each respective data transmission:

a priority value;

a source and a destination;

a number of data units;

a transfer time;

routing information;

a total number of transmissions which pass through a given communications node;

a maximum or minimum allowable value, mean value, or variance of any of an above listed value;

wherein said each respective data transmission or aggregate of said each respective data transmission are of a predetermined type or on a specific path or segment.

9. The computer chip of claim 8, wherein said statistical data include one or more of the following for each respective data transmission or aggregate of said each respective data transmission:

a number of times the maximum or minimum allowable value, mean value, or variance of the any of the above listed value is violated.

10. The computer chip of claim 1, wherein said plurality of communication nodes are bi-directionally coupled and are operable to communicate data with each other.

11. The computer chip of claim 9, wherein each communication node in a communication path is operable to perform bidirectional communications with every other communication node.

12. The computer chip of claim 1, wherein each of said communication nodes are directly connected to two or more other communication nodes.

* * * * *